(12) United States Patent
Vergnes et al.

(10) Patent No.: US 10,747,611 B2
(45) Date of Patent: Aug. 18, 2020

(54) SAFETY ENHANCEMENT FOR MEMORY CONTROLLERS

(71) Applicant: Microchip Technology Incorporated, Chandler, AZ (US)

(72) Inventors: Alain Vergnes, Trets (FR); Eric Matulik, Meyreuil (FR); Marc Maunier, Marseilles (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 228 days.

(21) Appl. No.: 15/871,594

(22) Filed: Jan. 15, 2018

(65) Prior Publication Data

US 2019/0220346 A1    Jul. 18, 2019

(51) Int. Cl.
| | | |
|---|---|---|
| *G06F 11/07* | (2006.01) | |
| *G11C 29/02* | (2006.01) | |
| *G11C 29/08* | (2006.01) | |
| *G11C 29/36* | (2006.01) | |
| *G11C 29/10* | (2006.01) | |
| *G11C 29/12* | (2006.01) | |
| *G11C 29/34* | (2006.01) | |
| *G11C 29/38* | (2006.01) | |
| *G11C 29/52* | (2006.01) | |
| *G06F 3/06* | (2006.01) | |
| *G06F 13/16* | (2006.01) | |

(Continued)

(52) U.S. Cl.
CPC ........ *G06F 11/0796* (2013.01); *G06F 3/0614* (2013.01); *G06F 3/0629* (2013.01); *G06F 13/1689* (2013.01); *G11C 29/022* (2013.01); *G11C 29/08* (2013.01); *G11C 29/10* (2013.01); *G11C 29/12* (2013.01); *G11C 29/1201* (2013.01); *G11C 29/34* (2013.01); *G11C 29/36* (2013.01); *G11C 29/38* (2013.01); *G11C 29/52* (2013.01); *G06F 3/061* (2013.01); *G06F 11/08* (2013.01); *G11C 2029/0409* (2013.01); *G11C 2029/3602* (2013.01)

(58) Field of Classification Search
CPC ..... G06F 11/07; G06F 11/079; G06F 11/0796
USPC .......................................................... 714/1
See application file for complete search history.

(56) References Cited

U.S. PATENT DOCUMENTS 3,916,306 A * 10/1975 Patti ....................... G01R 31/30
                                                              714/745
4,827,476 A *  5/1989 Garcia ............. G01R 31/31838
                                                              714/718

(Continued)

OTHER PUBLICATIONS

International Search Report and Written Opinion, Application No. PCT/US2019/013461, 17 pages, dated Apr. 8, 2019.

*Primary Examiner* — Kamini B Patel
(74) *Attorney, Agent, or Firm* — Slayden Grubert Beard PLLC

(57) ABSTRACT

A memory controller includes a generator circuit configured to generate a predetermined pattern of data, an address input, and a memory interface circuit. The memory interface circuit is configured to write the predetermined pattern of data to a memory at an address identified in the address input. The memory interface circuit is further configured to read a stored pattern of data from the memory at the address. The memory controller further includes an integrity checker circuit configured to compare the predetermined pattern of data and the stored pattern of data and identify an error of the memory based upon the comparison.

18 Claims, 6 Drawing Sheets

(51) Int. Cl.
*G11C 29/04* (2006.01)
*G06F 11/08* (2006.01)

(56) References Cited

U.S. PATENT DOCUMENTS

| | | | | |
|---|---|---|---|---|
| 2002/0184578 | A1* | 12/2002 | Yoshizawa | G11C 29/20 714/718 |
| 2007/0174717 | A1* | 7/2007 | Vamsee | G06F 11/2236 714/39 |
| 2007/0271421 | A1* | 11/2007 | Kim | G11C 11/412 711/154 |
| 2012/0099389 | A1* | 4/2012 | Park | G11C 11/40618 365/200 |
| 2013/0103890 | A1* | 4/2013 | Grunzke | G06F 13/1694 711/103 |

\* cited by examiner

SAFETY ENHANCEMENT FOR MEMORY CONTROLLERS

FIELD OF THE INVENTION

The present disclosure relates to reading and writing data to memory in electronic devices and, more particularly, to a safety enhancement for memory controllers.

BACKGROUND

As integrated circuit fabrication technology improves, semiconductor manufacturers are able to integrate additional functionality onto a single silicon substrate. As the number of these functionalities increases, however, so does the number of components on a single chip. Additional components may increase signal switching, in turn, generating more heat. The additional heat may damage various components of a chip. For example, memory devices that utilize p-channel metal-oxide semiconductor (P-MOS) transistors may be affected by the additional heat when the transistors are negatively biased over time, e.g., due to negative bias temperature instability (NBTI). Oxide degradation may also damage the transistors over time.

As memory devices degrade, their read or write stability may suffer, for example, due to shift in their gate threshold voltage. Designs may include margins to reduce the impact by such degradations, but the additional design margins may reduce performance and/or increase the requisite area to provide memory devices.

An effect of voltage drop-down may occur if the regulator or battery powering the said memory device is more resistive. This may reduce the voltage for short period of time when a peak of current occurs due to the simultaneous switching outputs of the memory controller and its associated memory controller. The peak of current may lead to a value of the voltage applied to the memory which is slightly lower than the allowed lower limit of the normal operating conditions of the memory device, for sure for a limited period of time. The more resistive the power supply (aging effect), the more the effect.

SUMMARY

Embodiments of the present disclosure include a memory controller. The memory controller may include a generator circuit configured to generate a predetermined pattern of data. The memory controller may include an address input. The memory controller may include a memory interface circuit configured to write the predetermined pattern of data to a memory at an address identified in the address input and read a stored pattern of data from the memory at the address. The memory controller may include an integrity checker circuit configured to compare the predetermined pattern of data and the stored pattern of data and identify an error of the memory based upon the comparison. In combination with any of the above embodiments, the predetermined pattern of data may be configured to cause a maximum number of simultaneous switching outputs of a data bus of the memory given a bit size of the predetermined pattern of data. In combination with any of the above embodiments, the predetermined pattern of data may include two portions to be separately written to and read from the memory, and the maximum number of simultaneous switching outputs is a result of respective values from the two portions. In combination with any of the above embodiments, the predetermined pattern of data is configured to cause crosstalk in one or more data bits in a data bus of the memory. In combination with any of the above embodiments, the predetermined pattern of data includes two portions to be separately written to and read from the memory, and the crosstalk is a result of respective values from the two portions. In combination with any of the above embodiments, the memory interface circuit and integrity checker circuit are configured to operate on a period determined by memory refresh command events. In combination with any of the above embodiments, the predetermined pattern of data includes an integrity check of one or more address locations in the memory device. In combination with any of the above embodiments, the predetermined pattern of data is configured to create a known condition for checking access integrity. In combination with any of the above embodiments, the memory interface circuit is configured to read and store an existing value from the address before writing the predetermined pattern of data to the address. In combination with any of the above embodiments, the memory interface circuit is configured to write the existing value to the address after reading the stored pattern of data from the memory at the address. In combination with any of the above embodiments, the memory interface circuit is configured to receive a memory command for the address before writing the predetermined pattern of data to the address, the predetermined pattern of data not defined by the memory command. In combination with any of the above embodiments, the memory interface circuit is configured to execute the memory command for the address after reading the stored pattern of data from the memory at the address.

Embodiments of the present disclosure may include a system, the system comprising a processor, a memory, and any of the above embodiments of memory controllers.

Embodiments of the present disclosure may include a microcontroller, the microcontroller comprising a processor, a memory, and any of the above embodiments of memory controllers.

Embodiments of the present disclosure may include methods for detecting or predicting errors in memory. The methods may include the operations performed by any of the above embodiments of memory controllers, systems, or microcontrollers.

DETAILED DESCRIPTION

Figure 1:
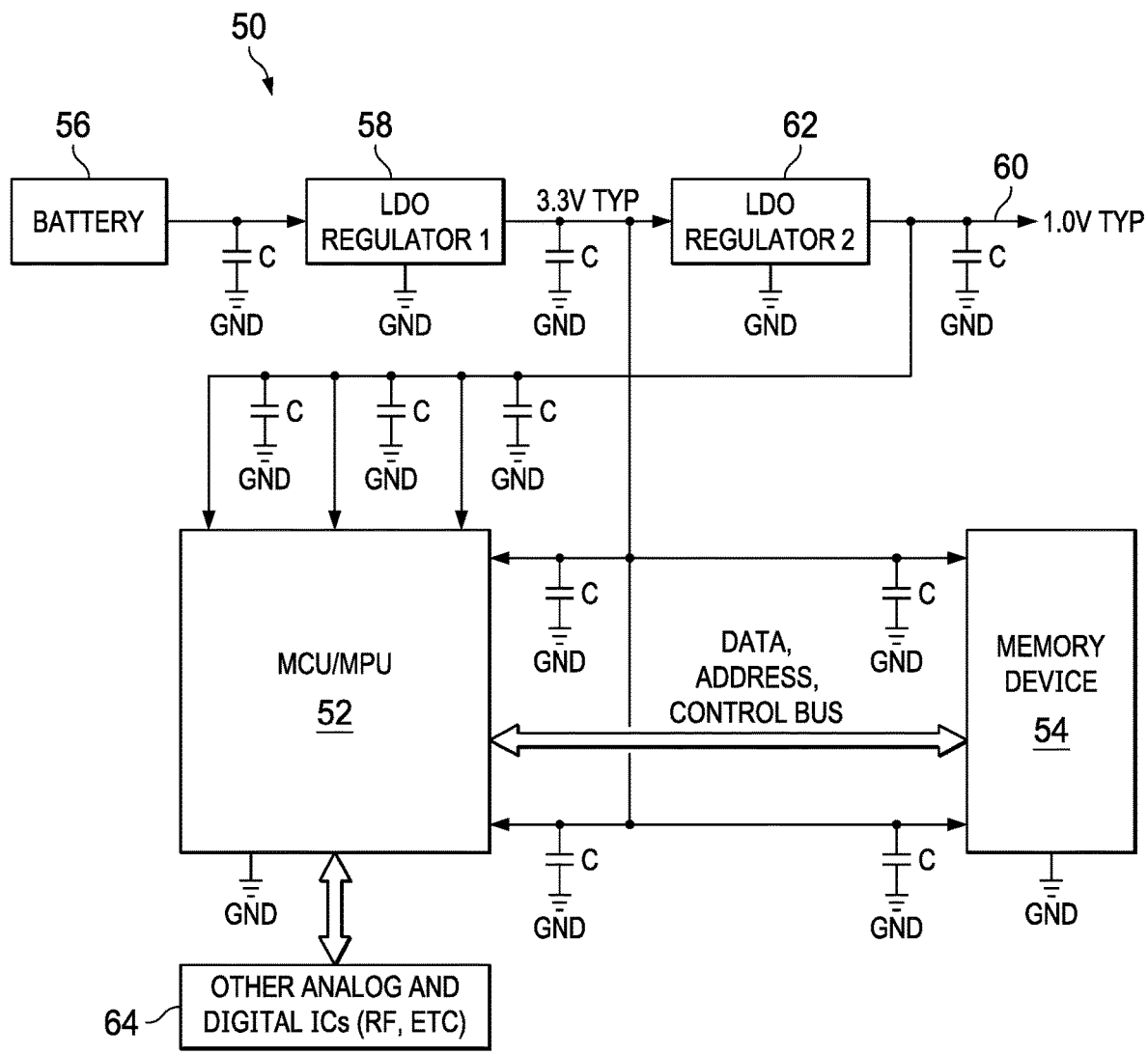
FIG. 1 illustrates an example system wherein a safety mechanism may be implemented, the system including a processor or microcontroller and a memory device, according to embodiments of the present disclosure.

FIG. 1 is an illustration of a system 50 including a safety enhancement for memory controllers, according to embodiments of the present disclosure. Although example elements of system 50 are illustrated in FIG. 1, system 50 may include any suitable number and kind of components. In one embodiment, a safety enhancement for memory controllers may be implemented in, for example, a microcontroller or microprocessor (MCU/MPU) 52. The safety enhancement may operate on how data is read or written to or from a memory 54. The safety enhancement may be implemented by any suitable combination of analog circuitry, digital circuitry, or instructions for execution by a processor. The safety enhancement may prevent or reduce the effects of problems due to component aging in system 50. The aging effects may arise during the lifetime of use by the components in system 50. Although MCU/MPU 52 is shown as controlling access to memory 54, and thus a site of implementation of the safety mechanism. The safety mechanism may be implemented in any location wherein control of a memory is performed. MCU/MPU 52 may be connected to memory 54 through suitable busses, as well as to other analog and digital integrated circuits.

System 50 may include a battery 56 or other power source. Battery 56 may experience an aging effect. The effect may include that the serial output resistivity of battery 56 increases over time. This may cause a voltage drop-down during peaks of current.

System 50 may include one or more voltage regulators, such as a low drop-out regulator (LDO) 58. LDO 58 may include potential aging effects. The serial output resistivity of LDO 58 may increase over time. As serial output resistivity increases ever time, this may cause a voltage drop-down during peaks of current. A voltage reference of LDO 58 may drift over time. The drift may reduce a margin of the system voltage, thus increasing sensitivity to decoupling capacitor values, etc. Similarly, another LDO 62 may experience aging effects. In system 50, LDO 58 may convert a supply voltage from battery 56 or another power source to a second voltage. For example, LDO 58 may convert a 5V or other voltage at battery 56 to 3.3V. The 3.3V signal may be provided to MCU/MPU 52, or memory 54. Furthermore, LDO 62 may convert the 3.3V signal to 1.0V. The 1.0V signal may be provided to MCU/MPU 52.

System 50 may include multiple decoupling capacitors 60 connected to various elements of system 50. Capacitors 60 may include potential aging effects. The serial output resistivity may increase over time. As serial output resistivity increases ever time, this may increase the voltage drop-down during peaks of current. Another effect may be that nominal capacitance value decreases over time. As a result, capacitor 60 may provide less charge in cases of peak current.

Memory 54 may include potential aging effects. One effect may be a memory array alteration effect. Due to aging, refresh time might not be as reliable as after the initial part of the product life. Furthermore, due to aging, termination resistor drift may occur, wherein specific data values can be altered. In addition, electro-magnetic external noise effects may arise, wherein data is altered.

Microcontroller 52 may include potential aging effects. One effect may be a double data rate (DDR) controller input/output (I/O) termination resistor drift, wherein data values may be changed. This might be handled otherwise by autocalibration on a regular basis.

Aging effects may or may not affect all components of system 50 together. The aging effects may affect the behavior of system 50 upon certain conditions occurring, such as system 50 encountering peak-of-current. It may be difficult to determine whether a given application running on system 50 will create an environment wherein an aging effect will affect the behavior of system 50.

The safety mechanism may include circuitry, transparent for a given executing application, that creates known worst case conditions and reports problems or takes corrective actions for system 50. Corrective action may include reporting the problem or switching the system into a reduced capacity or capability mode wherein conditions that may lead to further errors or instability are avoided. The worst-case conditions may be for DDR memory accesses.

Embodiments of the present disclosure may be implemented in circuitry for memory controllers, such as a memory controller driving static memory controller, SDR/DDR memory controller, or other suitable memory controllers. Embodiments of the present disclosure may include reports to system 50, such as to microcontroller 52. The reports may identify potential failures with external memory device as early as possible. For a microprocessor or microcontroller, the system memory is often made of external dynamic memories (SDR, DDR) that require refresh circuitry to maintain the stored values. These memory units may have large capacities that require deep-submicron technologies which may be subject to aging factors that may affect safety of the application, as well as cumulative effects resulting from aging factors of surrounding components soldered on the same printed board circuit. Without error correction circuitry, which adds a significative overhead in cost and silicon area, it might not be possible to reduce the effects of aging of such memory device or other effects that may alter the behavior. However, embodiments of the present disclosure may report, as quickly as possible, a visible effect of a failure due to aging effect or other cumulative effects between components aging, low voltage, worst conditions for crosstalk or simultaneously switching outputs.

Problems may arise, for example, as a voltage close to the minimum allowed voltage may alter the read or write accesses of microcontroller 52 into its external system RAM in memory 54. Similar problems may occur when the voltage is slightly lower than, for a very short period of time, than the minimum allowed voltage. This may occur, for example, when there are a large number of simultaneously switching outputs. Such a case may occur when, for example, for a 16-bit data bus when switching from 0x0000 to 0xFFFF, wherein the 16 data bits are switching together. In such a case, the peak of current may be higher than for other patterns on the data bus. If at the same time the decoupling capacitor are no longer nominal due to aging, the result may create read issues in terms of cumulative effects.

When only few inputs and outputs are switching, the voltage drop in regulators might not be important and no error seen. Switching 16-bits at the same time might not be encountered very often for an application software, so having a circuitry capable of producing such events not only at each start-up of the product but also on a regular basis may provide more safety. By creating worst conditions on a data bus, on a regular basis, system 50 may anticipate or even pre-date effects on application software. By causing and analyzing abnormal accesses to or from the memories, system 50 may improve overall safety by more reliable mechanisms (such as hardware circuitry) compared to software routines that by definition requires access to memories.

As discussed above, embodiments of the present disclosure may be implemented within a microcontroller but can be implemented in any other type of integrated circuit driving a memory device. In a microprocessor circuit, there might be no embedded flash memory and the system memory is often made of an external memory device of type SDR-SDRAM or DDR-SDRAM. These dynamic memories may be manufactured with deep submicron technologies and the charge of electrons for each memory cell is so small that it requires to be refreshed every 64 ms (common value) to maintain the stored value. In microprocessors, the SDRAM (either DDR, SDR or both) controller may include circuitry driving the external memory device. The refresh command is managed and sent on a regular basis by the DDR controller to the memory device.

Embodiments of the present disclosure may be implemented in hardware logic and circuitry of a digital type, like the controller itself that ensures on a regular basis that the stored value is correct and also performs a check on a predefined location of the memory by writing and reading and checking specific pattern to produce worst conditions or a given effect. For example, embodiments of the present disclosure may read a known value at a predefined address, write a 16-bit value 0xAAAA, then read this value and check for accuracy, then write the opposite digital value, such as 0x5555 (the complement of 0xAAAA), then read this value and check for accuracy, and finally writing back to the memory the initial value which is used by the application software. Any suitable complementary pair of numbers may be used. The pattern of values written and read may include a pattern using the maximum number of simultaneous switching outputs and the maximum crosstalk on a PCB board and on internal DDR memory device. For DDR memory system without an ECC feature, embodiments of the present disclosure may report a potential aging effect or other effect that may affect the system stability. Aging of the components may affect the data storage stability, especially when coupled to other effects like crosstalk; operating voltage close to the minimum allowed boundaries; and aging of decoupling capacitors around the microcontroller and memory device. In addition, a classical integrity check monitor (ICM) using cyclical redundancy checking or other algorithms may be used. The ICM may be a peripheral, implemented by digital circuitry, instructions for execution by a processor, or a suitable combination thereof. The ICM may be connected on a system bus and internal to a microcontroller. The ICM may be configured to verify the integrity of data stored in memory. It may check, for example, if a bit toggles in memory without any function due to noise or other factors, an ICM may identify the error. Embodiments of the present disclosure may complement operation of ICMs by identifying problems not detectable by ICMs. To perform a check, embodiments of the present disclosure may read and write in the memory device. During this time of checking, application software might not be executed. The period of time used for checking by embodiments of the present disclosure may be referred to as a check period. The check period can be aligned with the refresh period of the memory, wherein the refresh period is a native feature of memory. The check period can be a sub-multiple of that refresh period. The check period can be configurable.

A problem may be identified wherein a value written or read does not correspond to an expected value. In case of an identified problem, embodiments of the present disclosure may generate an interrupt in system 50 in which an interrupt software handler is located in, for example, an embedded SRAM. This may result from the embedded SRAM being less sensitive to drop-down voltage. In one embodiment, the circuitry may be configured to check one or more locations of the memory each time a check period starts. In case an executing application uses ECC (Error Code Correction) memories (requires larger DDR memories), the checking circuitry may be switched off or not used. By implementing embodiments of the present disclosure in a memory controller, accesses of specific patterns may be prevented from overloading the internal system busses of the microcontroller. Nevertheless, in other embodiments the checking circuitry may be located outside the memory controller and generate patterns dedicated to safety checks, routed by the system to the memory controllers.

Figure 2:
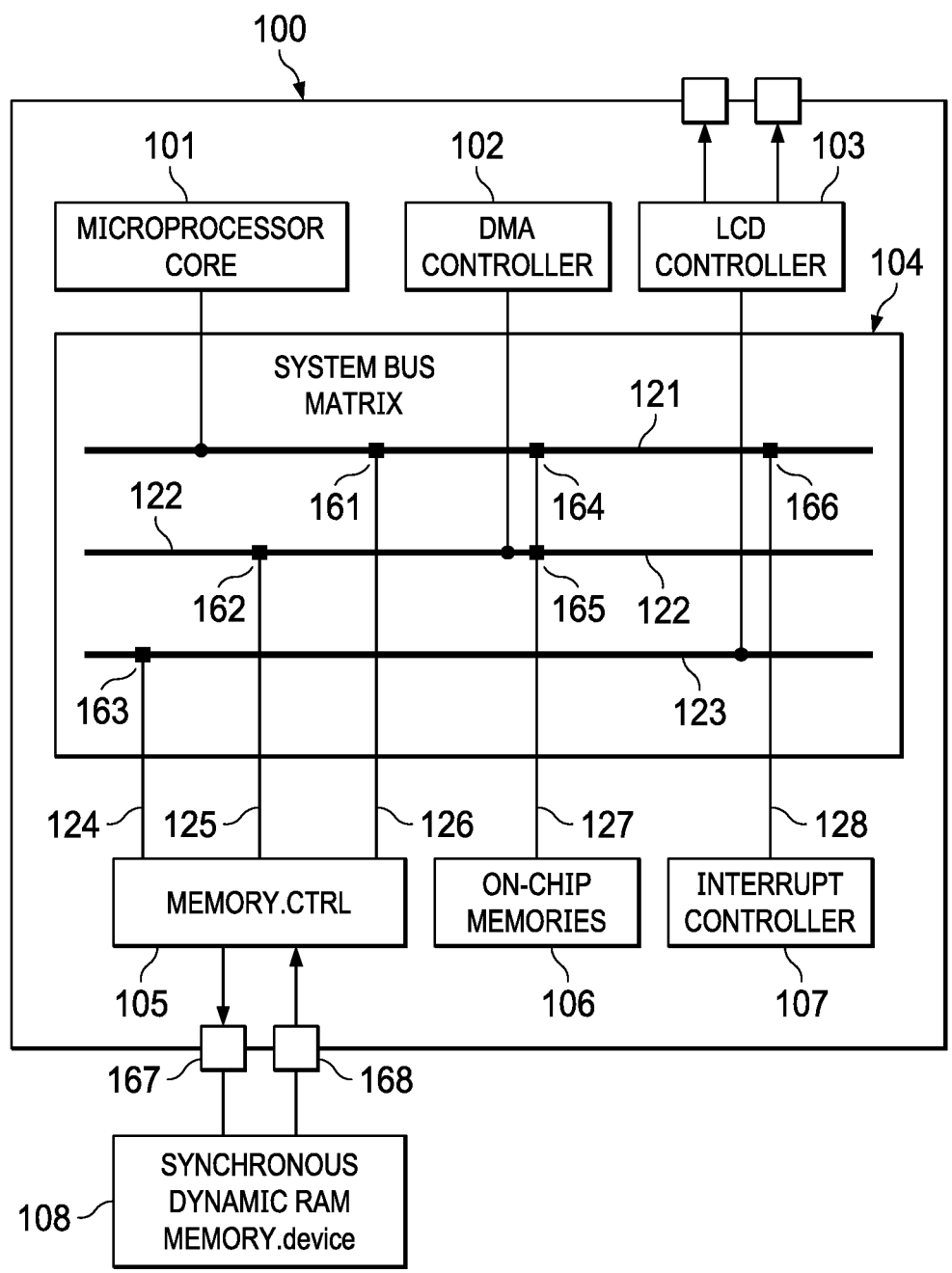
FIG. 2 illustrates another view of an example system wherein a safety mechanism may be implemented, according to embodiments of the present disclosure.

FIG. 2 illustrates another view of a system with a microcontroller and a memory device according to embodiments of the present disclosure. Microcontroller 100 may be implemented as a microprocessor or a microcontroller. Included may be a microprocessor core 101 and a system bus 104 comprising several busses, called a bus matrix being able to route the requested accesses by masters to slaves. Master peripherals 101, 102, 104 may be configured to launch a read or write access to a slave peripheral 105, 106, 107. The accesses initiated by masters are routed to slaves by a system bus matrixes comprising arbiters (not shown), address decoders (not shown) and multiplexers (not shown). These sub-modules are not shown for easier readability. Slave 105 may include an external memory controller that can be either a static memory controller or dynamic memory controller (SDR/DDR-SDRAM). Peripheral 108 may thus be the external memory device where the data or code to execute is stored. Peripherals may be implemented by any suitable combination of analog circuitry, digital circuitry, or instructions for execution by a processor.

System bus matrix 104 may include a routing scheme that is provided by black squares 161, 162, 163, 164, 165. In FIG. 2, peripheral 101 may be configured to drive system bus 121 including address, read data, write data, and control signals. Peripheral 102 (DMA controller) may be configured to drive system bus 122, and LCD controller 103 may be configured to drive system bus 123.

Black square 161 may illustrate the capability for core 101 to access (read/write) memory controller 105. Black square 164 may indicate the capability for peripheral 101 to also drive on-chip memory 106. Black square 166 may indicate the capability for peripheral 101 to drive peripheral 107. Square 162 interconnects the system bus 122 driven by DMA controller 102 to memory controller 105. Square 163 interconnects the system bus 123 driven by LCD controller 103 to memory controller 105. Thus, squares 161, 162, 163 indicate the possibility of module 104 (system bus matrix) to route all the masters 101, 102, 103 accesses to external memory controller 105. Each of the access from a master is routed to system bus 124, 125, 126,127,128. For each master, an address decoder (not shown) determines which of the system bus 124,125,126,127,128 is to be to selected. There is a selection signal for each port of each slave (not shown to ease readability). For example, if a microcontroller initiates an access on system bus 121, the address decoder (not shown) resulting from squares 167, 164, 166 decodes the address bus and asserts the corresponding chip select, each chip select line being respectively located in system bus 126, 127, 128. When the masters access the external memory device 108, the memory controller 105 translates the system bus protocol into the memory access protocol carried on pads 167 and 168.

When dynamic memory devices are used, the memory controller is also in charge of generating the refresh commands that are also carried on the same memory bus through 167 and 168.

Figure 3:
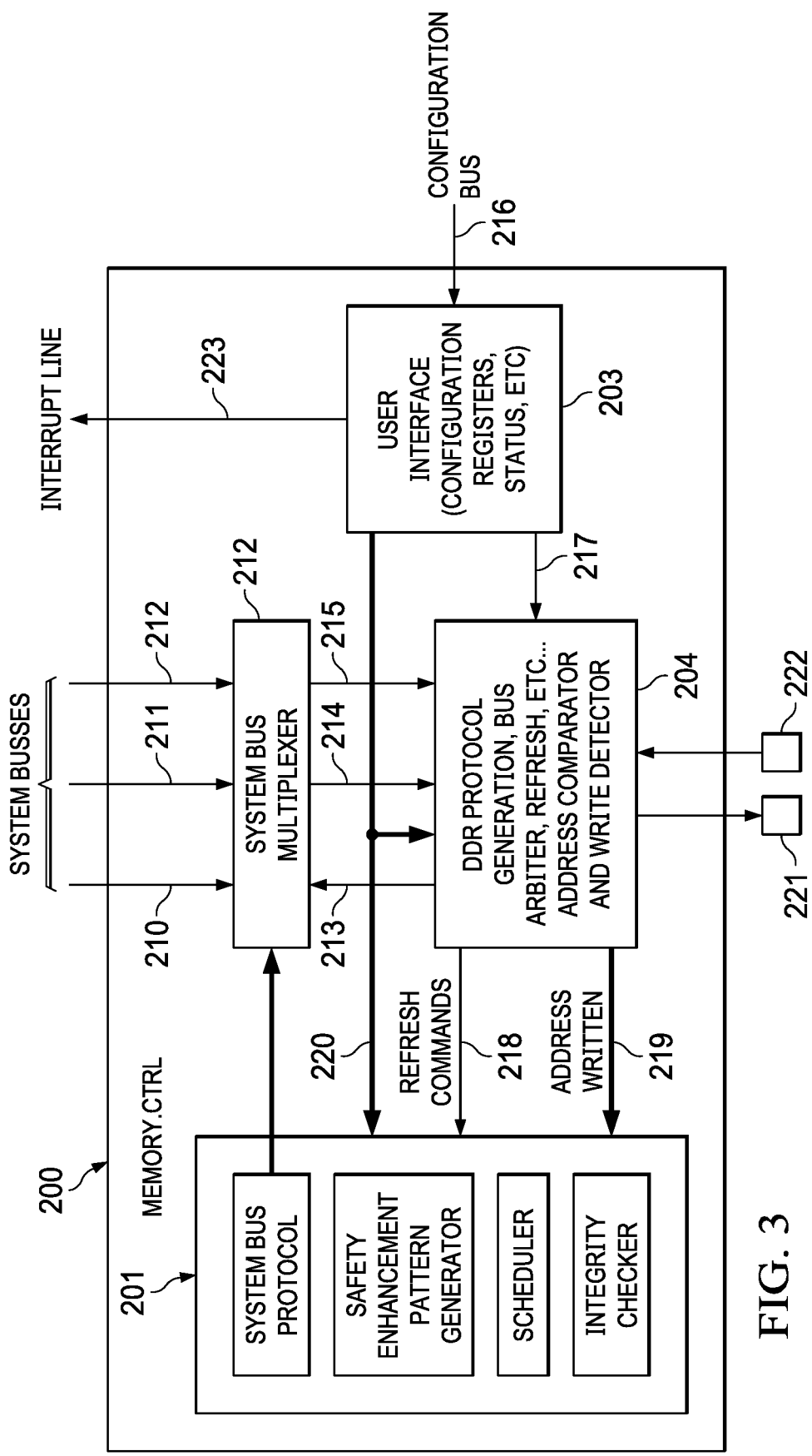
FIG. 3 illustrates a more detailed architecture of a memory device controller, according to embodiments of the present disclosure.

FIG. 3 illustrates a more detailed architecture of a memory device controller 200, according to embodiments of the present disclosure. Such a memory device controller may be implemented in, for example, the microcontrollers of FIGS. 1 and 2. Memory device controller 200 may implement, fully or in part, controller 105 of FIG. 2. Dynamic memory controller 200 may monitor memories on or connected to the microcontroller of FIG. 2.

Dynamic memory controller 105 of FIG. 2 may handle system busses illustrated in FIG. 3 with busses 210, 211, 212. In dynamic memory device 200, the protocol introduces latencies for read accesses. These latency periods of time can be used to provide commands to the memory device according to the next accesses that will requested, thus optimizing the overall bandwidth.

To have the information of potential next access to perform, several system busses may be observed or monitored in parallel. Accordingly, several system busses (three in the example provided) may be monitored. Thus, if several system busses are managed, a multiplexer and an arbiter may be used to control a multiplexer 202 for selection. An arbiter may be inside sub-module 204 and configured to convert the system bus protocol into dynamic memory protocol. The arbiter may also manage the refresh commands sent to memory devices through ports 221, 222. Depending on the type of memory device driven by ports 221, 222 the protocol may slightly differ (DDR1, DDR2, DDR3, LPDDR, etc.) and thus a set of configuration registers are provided in module 203 to manage these differences.

The external memory of dynamic types embeds large amount of memory that requires deep-submicron technologies and a very low silicon area for each memory cell. The stored data cannot be maintained a long time without a refresh mechanism. A common refresh period of the overall memory plane is 64 ms. This value may ensure the integrity of the data stored in the memory under normal operating conditions. Aging of the components may affect this stability, coupled to other effects like crosstalk, operating close to the minimum allowed boundaries, and aging of decoupling capacitors around microcontroller and memory device.

While the application operating on the microcontroller is running a software located in external memory device, if there is a failure condition while reading the memory to execute code, the system may enter an unpredictable behavior for a period of time until the watchdog circuitry (not shown but part of the system illustrated in FIG. 2) triggers a system reset.

To reduce these kind of effects, controller 200 may include a circuitry 201 configured to generate specific patterns on a regular basis. These patterns are made of read and write accesses and carried on the same busses as functional busses. These accesses are multiplexed and drives internal system bus 214 like any other accesses (application software accesses) carried on internal system busses 210, 211, 212. These additional and regular accesses may be made at predefined addresses in the memory device. The address locations may be provided by the user, configuration software, or application software through user interface module 203. Thus, additional configuration registers may be added in module 203 for the purpose of the invention. The address location to be checked may be carried on signal 220 to module 201.

Module 201 may generate a read or write pattern on a regular basis. In one embodiment, the period is based on refresh command period in circuitry in module 204 and reused. The refresh command event may be carried on signal 218. Accordingly, module 201 may be able to count a number of refresh command events before triggering a check pattern at address defined by signal 220. This check pattern period may be created by the scheduler part of circuitry 201.

Then the pattern may be internally created by a sequencer (also known as a state machine or sub-module safety enhancement pattern generator) in module 201. Generation of the pattern may be implemented by a digital logic circuit. The pattern may be stored to and read from memory. A system bus protocol circuitry may be included in module 207 to convert the pattern into the system bus protocol of the overall system.

Another bus may be added to multiplexer 202. This can be performed in any suitable manner. The system bus protocol sub-module of invention circuitry 201 is shown for illustrative purposes. The address to check may be used by the application software. Accordingly, writing specific values at the address that would be used by the application software would kill the application software if the original (application) value was not restored at the end of the safety check sequence. Thus, the safety check pattern starts with a read to predefined address to check, the value is stored, the check pattern starts and at the end of the safety pattern the module 201 writes back the application value into checked address.

Figure 4:
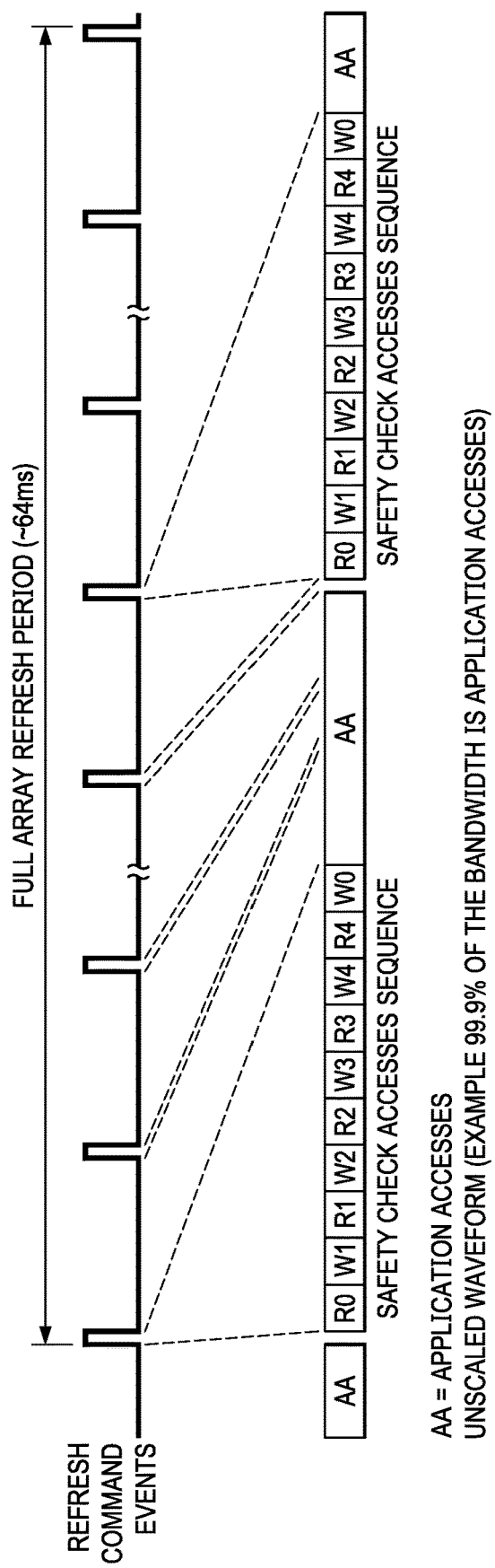
FIG. 4 illustrates a sequence of memory accesses, according to embodiments of the present disclosure.

FIG. 4 illustrates a sequence of memory accesses, according to embodiments of the present disclosure. The safety check pattern starts with a read to predefined address to check, the value is stored, the check pattern starts and at the end of the safety pattern the module 201 writes back the application value into checked address.

In FIG. 4, the check pattern generation period is not scaled compared to the overall memory array refresh period. This is presented for illustrative purposes only. The check pattern duration should be as low as possible to keep as much bandwidth available as possible for application software. In FIG. 4, the check pattern consists of a first read access R0 to memory array, where the value of the address to check is read to be stored in module 201. Then a series of write and read are performed. The actions write-1 (W1), read-1 (R1), write-2 (W2), read-2 (R2) generates a data pattern. The pattern may be 16-bits for illustrative purposes, and may be the values 0x5555, 0xAAAA. The pattern may be configured to generate crosstalk conditions on, for example, printed circuit board DDR data lines. Another part of the safety check pattern, or a different safety check pattern, may include actions write-3 (W3), read-3 (R3), write-4 (W4), read-4 (R4). The W3R3, W4R4 safety check pattern may include values of writing and reading 0x0000 followed by writing and reading 0xFFFF. This pattern may be configured to generate conditions for a large or maximum number of simultaneously switching outputs.

For each read access, the read data is compared with expected value. If the data does not compare with the expected data, module 201 may report a flag to user interface 203. This signal can be the source of an interrupt 223. Problems encountered by reading or writing the external DDR memory can be anticipated, managed in a safer way than in system without any check or just a check at startup of the system.

Figure 5:
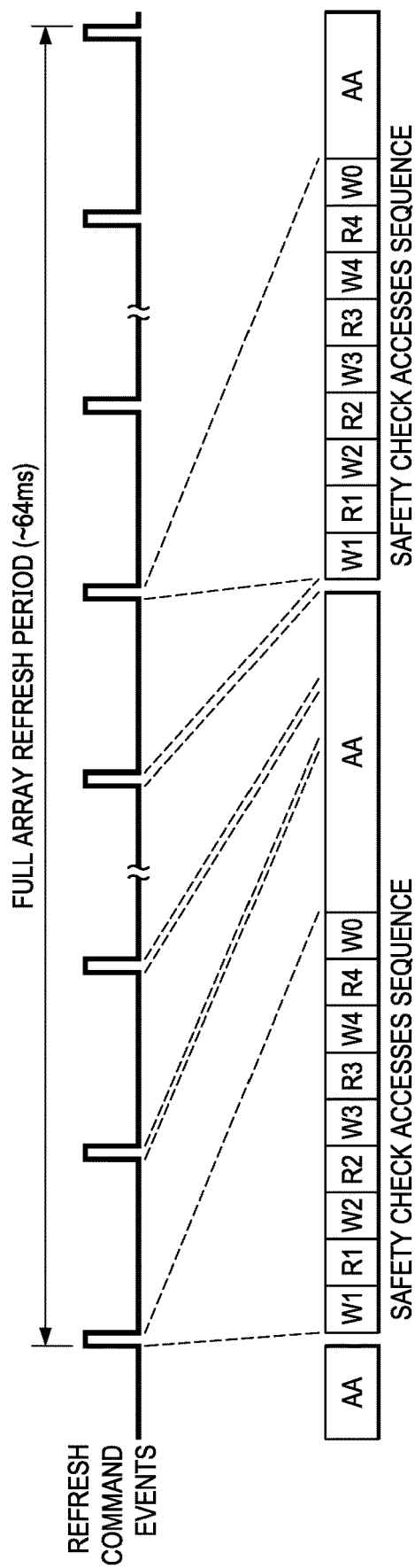
FIG. 5 illustrates another sequence of memory accesses, according to embodiments of the present disclosure.

Then the application data is written back to the checked address so that the application software can continue to operate. The safety check sequence is made of, for example, ten successive accesses in the memory plane. It can be optimized by removing the first read access. The memory controller is aware of all the accesses performed on the memory device, thus as soon as a write access is performed on predefined address to check (value carried on signal 220 of FIG. 2), the memory controller can internally store the data that is being written to this address, thus there is no more need to read this value at the beginning of the check sequence. This is illustrated in FIG. 5. FIG. 5 illustrates another sequence of memory accesses, according to embodiments of the present disclosure. A first read is omitted as the sequence may be carried out when data is to be written to memory. The data to be written to memory from the application may be stored temporarily.

Figure 6:
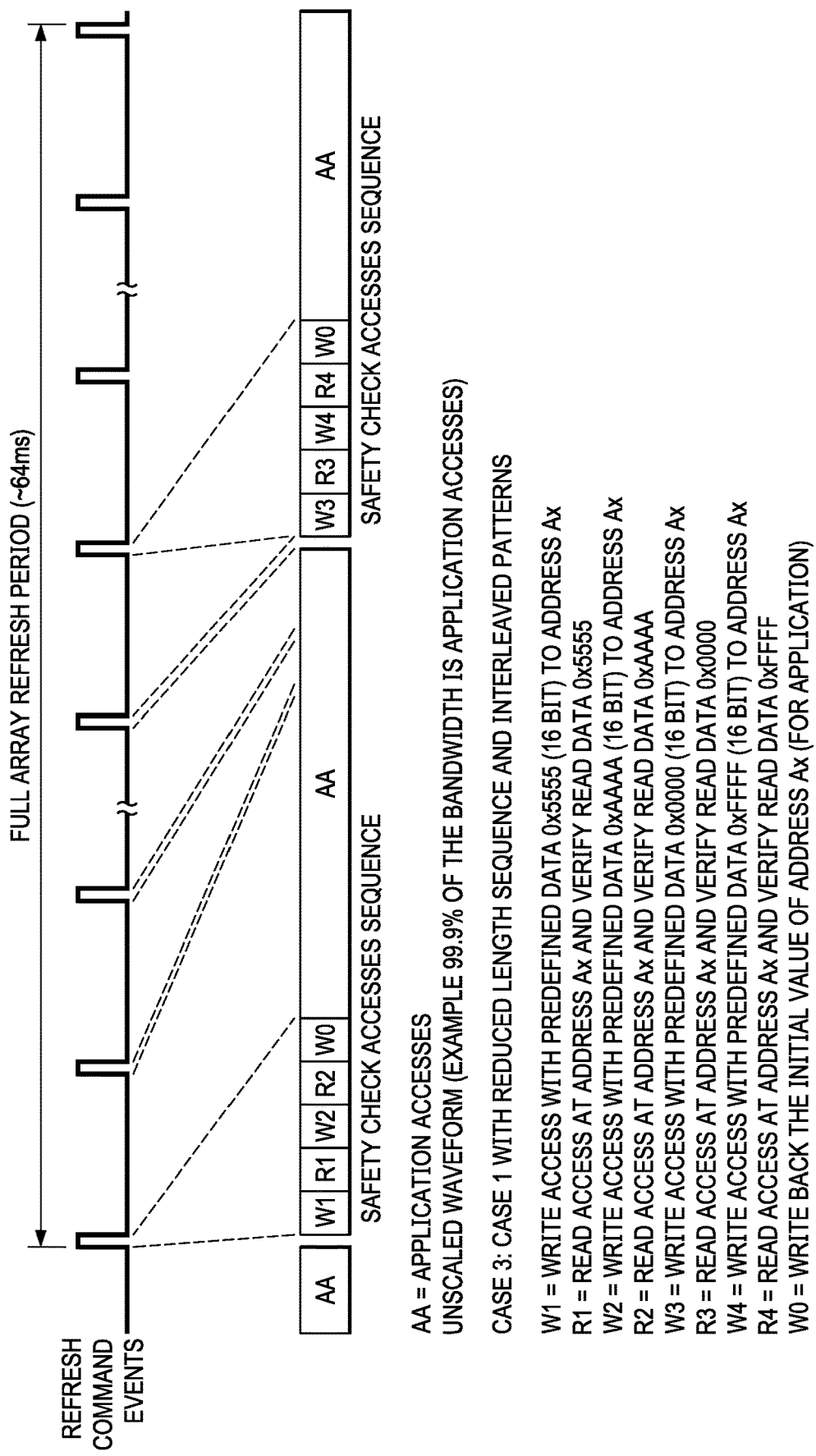
FIG. 6 illustrates a timing change for the sequence of memory accesses, according to embodiments of the present disclosure.

FIG. 6 illustrates a timing change for the sequence of memory accesses, according to embodiments of the present disclosure. The pattern can be again optimized in terms of duration by alternating the pattern dedicated to crosstalk and the pattern dedicated to simultaneously switching outputs. This is illustrated in FIG. 6.

Other solutions, such as ECC (Error Correction Code) may be an efficient way to solve issues. However, this may be expensive in terms of memory size. Integrity check monitors are another method for addressing safety and security. However, any error may be detected therein too late (with a lot of latencies) and may affect the behavior of the system if the memory contains executable code. Because it is not possible to detect error on a real-time basis, other than with ECC, embodiments of the present disclosure include circuitry that can provide more safety with an insignificant amount of logic in the MPU and no extra cost (like ECC) on DDR memory side.

Embodiments of the present disclosure include circuitry configured to generate repeated dummy accesses to a memory device; create known worst conditions for peak of current via data patterns embedded in these accesses; and create known worst conditions for crosstalk via data patterns embedded in these accesses, also verifying the refresh capability (dynamic memories) of the memory device by checking the content of one or more locations. No software is required to manage these additional accesses and it is fully transparent for the user.

Challenges to implementing the embodiments of the present disclosure via software, as opposed to implementations in hardware and circuitry as shown above, include the fact that if software provides or accesses the refresh trigger event by an interrupt, the interrupt has a processing latency which may slow down the system. Such latency might be too slow to implement during the short time required to otherwise implement memory accesses for read and write operations. If not provided by an interrupt, a hardware trigger circuitry (timer) can be used. When a timer outside the memory is used, the specific checking pattern must not be interrupted to prevent the application software from reading data which belong to the checking data pattern and are not application data.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A memory controller, comprising:
    a generator circuit configured to generate a predetermined pattern of data;
    an address input;
    a memory interface circuit configured to:
        write the predetermined pattern of data to a memory at an address identified in the address input; and
        read a stored pattern of data from the memory at the address; and
    an integrity checker circuit configured to:
        compare the predetermined pattern of data and the stored pattern of data; and
        identify an error of the memory based upon the comparison;
    wherein the predetermined pattern of data is configured to cause a maximum number of simultaneous switching outputs of a data bus of the memory given a bit size of the predetermined pattern of data.

2. The memory controller of claim 1, wherein the predetermined pattern of data includes two portions to be separately written to and read from the memory, and the maximum number of simultaneous switching outputs is a result of respective values from the two portions.

3. The memory controller of claim 1, wherein the predetermined pattern of data is configured to cause crosstalk in one or more data bits in a data bus of the memory.

4. The memory controller of claim 3, wherein the predetermined pattern of data includes two portions to be separately written to and read from the memory, and the crosstalk is a result of respective values from the two portions.

5. The memory controller of claim 1, wherein the memory interface circuit and integrity checker circuit are configured to operate on a period determined by memory refresh command events.

6. The memory controller of claim 1, wherein the predetermined pattern of data includes an integrity check of one or more address locations in the memory device.

7. The memory controller of claim 1, wherein the predetermined pattern of data is configured to create a known condition for checking access integrity.

8. The memory controller of claim 1, wherein the memory interface circuit is configured to:
    read and store an existing value from the address before writing the predetermined pattern of data to the address; and
    write the existing value to the address after reading the stored pattern of data from the memory at the address.

9. The memory controller of claim 1, wherein the memory interface circuit is configured to:
    receive a memory command for the address before writing the predetermined pattern of data to the address, the predetermined pattern of data not defined by the memory command; and
    execute the memory command for the address after reading the stored pattern of data from the memory at the address.

10. A system, comprising:
    a processor;
    a memory;
    a generator circuit configured to generate a predetermined pattern of data;
    an address input;
    a memory interface circuit configured to:
        write the predetermined pattern of data to the memory at an address identified in the address input; and
        read a stored pattern of data from the memory at the address; and
    an integrity checker circuit configured to:
        compare the predetermined pattern of data and the stored pattern of data; and
        identify an error of the memory based upon the comparison;
    wherein the predetermined pattern of data is configured to cause a maximum number of simultaneous switching outputs of a data bus of the memory given a bit size of the predetermined pattern of data.

11. The system of claim 10, wherein the predetermined pattern of data includes two portions to be separately written to and read from the memory, and the maximum number of simultaneous switching outputs is a result of respective values from the two portions.

12. The system of claim 10, wherein the predetermined pattern of data is configured to cause crosstalk in one or more data bits in a data bus of the memory.

13. The system of claim 12, wherein the predetermined pattern of data includes two portions to be separately written to and read from the memory, and the crosstalk is a result of respective values from the two portions.

14. The system of claim 10, wherein the memory interface circuit and integrity checker circuit are configured to operate on a period determined by memory refresh command events.

15. The system of claim 10, wherein the predetermined pattern of data includes an integrity check of one or more address locations in the memory device.

16. The system of claim 10, wherein the predetermined pattern of data is configured to create a known condition for checking access integrity.

17. The system of claim 10, wherein the memory interface circuit is configured to:
 read and store an existing value from the address before writing the predetermined pattern of data to the address; and
 write the existing value to the address after reading the stored pattern of data from the memory at the address.

18. The system of claim 10, wherein the memory interface circuit is configured to:
 receive a memory command for the address before writing the predetermined pattern of data to the address, the predetermined pattern of data not defined by the memory command; and
 executing the memory command for the address after reading the stored pattern of data from the memory at the address.

* * * * *